United States Patent
Bailey et al.

(10) Patent No.: US 9,643,233 B2
(45) Date of Patent: May 9, 2017

(54) BI-DIRECTIONAL AIRFLOW HEATSINK

(71) Applicant: DELL PRODUCTS, L.P., Round Rock, TX (US)

(72) Inventors: Edmond I. Bailey, Cedar Park, TX (US); Christopher M. Helberg, Austin, TX (US); Travis C. North, Cedar Park, TX (US); Austin Michael Shelnutt, Leander, TX (US)

(73) Assignee: Dell Products, L.P., Round Rock, TX (US)

( * ) Notice: Subject to any disclaimer, the term of this patent is extended or adjusted under 35 U.S.C. 154(b) by 157 days.

(21) Appl. No.: 14/493,279

(22) Filed: Sep. 22, 2014

(65) Prior Publication Data

US 2016/0088775 A1    Mar. 24, 2016

(51) Int. Cl.
*H05K 7/20*    (2006.01)
*B21D 53/02*    (2006.01)
*H01L 23/473*    (2006.01)

(52) U.S. Cl.
CPC ....... *B21D 53/022* (2013.01); *H05K 7/20727* (2013.01)

(58) Field of Classification Search
CPC . G06F 1/181–1/182; H05K 7/20218–7/20381; H05K 7/20409–7/20418; H05K 7/20009–7/202; H01L 23/46–23/3677
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 7,382,616 B2 | 6/2008 | Stefanoski | |
| 2005/0145366 A1 | 7/2005 | Erel | |
| 2006/0120035 A1* | 6/2006 | Merz | G02F 1/133308 361/679.34 |
| 2006/0171123 A1* | 8/2006 | Hornung | H01L 23/433 361/704 |
| 2006/0198105 A1* | 9/2006 | Wyatt | G06F 1/203 361/697 |
| 2006/0215363 A1* | 9/2006 | Shipley | H05K 7/20563 361/695 |
| 2007/0035925 A1* | 2/2007 | Kobayashi | G06F 1/20 361/688 |
| 2007/0047200 A1* | 3/2007 | Huang | G06F 1/20 361/695 |
| 2007/0171614 A1* | 7/2007 | Pedoeem | H04L 12/18 361/695 |

(Continued)

*Primary Examiner* — Anthony Haughton
*Assistant Examiner* — Razmeen Gafur
(74) *Attorney, Agent, or Firm* — Isidore PLLC

(57) ABSTRACT

An information handling system (IHS) has a heatsink including cooling fins each having a plate structure and attached to the base in spaced parallel arrangement for receiving a first air flow that is in parallel alignment to the conductive surface. The heatsink includes a tunnel formed through the cooling fins perpendicularly to the first air flow. The IHS provides cooling air to one or more heatsinks without thermally shadowing other compute components as well as providing a second flow of cooling air to downstream component/s via the tunnel of each heatsink.

13 Claims, 10 Drawing Sheets

(56) References Cited

U.S. PATENT DOCUMENTS

| | | | |
|---|---|---|---|
| 2007/0230118 A1* | 10/2007 | Leija | H05K 7/20718 361/690 |
| 2008/0068800 A1* | 3/2008 | Foster, Sr. | H01L 23/467 361/697 |
| 2008/0106864 A1* | 5/2008 | Merino | G06F 1/181 361/688 |
| 2008/0151501 A1* | 6/2008 | Takasou | H05K 7/20154 361/697 |
| 2008/0218969 A1* | 9/2008 | Muraki | G06F 1/206 361/695 |
| 2009/0034171 A1* | 2/2009 | Hayashi | G06F 1/20 361/679.49 |
| 2009/0097203 A1* | 4/2009 | Byers | H05K 7/20618 361/695 |
| 2009/0116188 A1* | 5/2009 | Fong | H05K 7/20909 361/695 |
| 2009/0154104 A1* | 6/2009 | Kondo | G06F 1/20 361/700 |
| 2009/0262497 A1* | 10/2009 | Beauchamp | G06F 1/20 361/679.49 |
| 2009/0310301 A1* | 12/2009 | Nelson | H05K 7/20163 361/695 |
| 2010/0033687 A1* | 2/2010 | Utsunomiya | G03B 21/16 353/58 |
| 2010/0172098 A1* | 7/2010 | Isoshima | H05K 7/20972 361/697 |
| 2010/0254086 A1* | 10/2010 | Ikeda | H05K 7/20145 361/697 |
| 2010/0302727 A1* | 12/2010 | Bellin | H05K 7/20581 361/679.49 |
| 2011/0058330 A1* | 3/2011 | Abraham | G06F 1/20 361/679.47 |
| 2011/0080701 A1* | 4/2011 | Bisson | H05K 7/20563 361/679.5 |
| 2011/0116230 A1* | 5/2011 | Kwak | H01Q 1/02 361/692 |
| 2012/0002371 A1* | 1/2012 | Tan | H05K 7/20445 361/709 |
| 2012/0050991 A1* | 3/2012 | Tamanuki | H01L 23/467 361/697 |
| 2013/0141867 A1* | 6/2013 | Zhou | H05K 7/20909 361/691 |
| 2013/0188309 A1* | 7/2013 | Ross | H05K 7/20727 361/679.48 |
| 2013/0242542 A1* | 9/2013 | Uchimi | H05K 7/20136 362/97.1 |
| 2014/0076521 A1 | 3/2014 | Lin et al. | |

* cited by examiner

BI-DIRECTIONAL AIRFLOW HEATSINK

RELATED APPLICATIONS

The present application is related to commonly-owned application entitled "EMBEDDED CHASSIS DUCTING SYSTEM FOR PARALLELIZING AIRFLOW THROUGH COMPONENTS ORIENTED IN SERIES" to Alvarado, et al., filed on even date herewith.

BACKGROUND

1. Technical Field

This disclosure generally relates to information handling systems (IHS), and more particular to a heatsink that receives cooling air bi-directionally.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Integrated circuit (IC) manufacturers often dictate the geometric layout of components on a server board within a server chassis of an IHS. Multiple central processing unit (CPU) sockets and random access memory (RAM) modules are particular examples of such geometries that may be laid out without considerations for cooling within the server chassis. These geometric specifications coupled with the standard information technology (IT) rack layout used today can result in challenging cooling conditions where heat dissipating components are oriented in series with respect to the airflow path. As air moves through one component and absorbs heat (increasing its temperature), the pre-heated air is then passed through additional components with reduced cooling effectiveness. This process is often referred to as 'thermal shadowing' or preheating.

ICs such as CPUs and video graphic chips generate a substantial portion of the thermal energy that must be dissipated to avoid overheating and failure. Typically a heatsink with a finset of cooling fins is closely attached to the IC to conductively receive and to convectively dissipate the thermal energy to a cooling air that passes through a server chassis. Even if not impinged directly by the air flow that passes through the heatsink, adjacent components can receive preheated air due to thermal energy that radiates laterally from such heatsinks.

BRIEF SUMMARY

The illustrative embodiments of the present disclosure provide a heatsink that includes a base having a conductive surface for receiving thermal energy. The heatsink includes a finset of more than one cooling fin each having a plate structure and attached to the base in spaced arrangement. The finset receives a first air flow that is parallel to each of the cooling fins. A tunnel is formed in parallel to the conductive surface on a bottom of the base and through the more than one cooling fin. The tunnel is also formed perpendicularly to the first air flow. The tunnel directs a second air flow to a downstream compute component without contacting along the fins of the heatsink in order to mitigate thermal shadowing.

In one embodiment, an information handling system (IHS) includes a chassis enclosure having a cold air inlet and a hot air exhaust. The IHS includes a compute component that generates thermal energy. The IHS includes the heatsink which includes the tunnel and which is series aligned with and closer to the cold air inlet than the compute component. A ducting structure is provided in the chassis enclosure and supplies cold air to the first and second air flows.

According to at least one aspect of the present disclosure, a method is provided of cooling two compute components of an IHS. The method includes directing a first air flow through cooling fins of a finset of a heatsink. Each cooling fin has a plate structure and is attached to a base of the heatsink in spaced arrangement from adjacent cooling fins. The base has a conductive surface in contact with a first compute component and which receives and dissipates thermal energy from the first compute component. The method includes directing a second air flow to a second compute component through a tunnel of the heatsink formed through one of the base and the more than one cooling fin spaced apart from the conductive surface and perpendicular to the first air flow.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

Figure 1A:
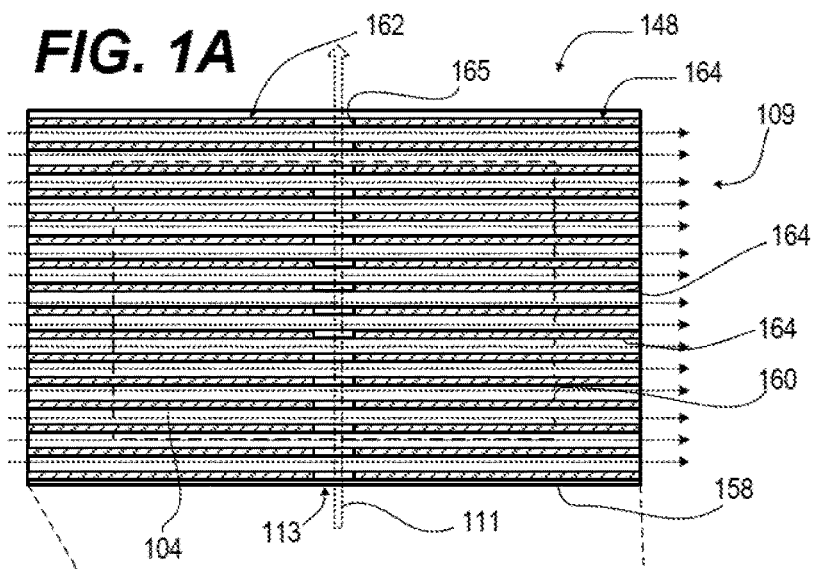
FIG. 1A illustrates a diagrammatic top view of a bi-directional heatsink, according to one or more embodiments.
Figure 1B:
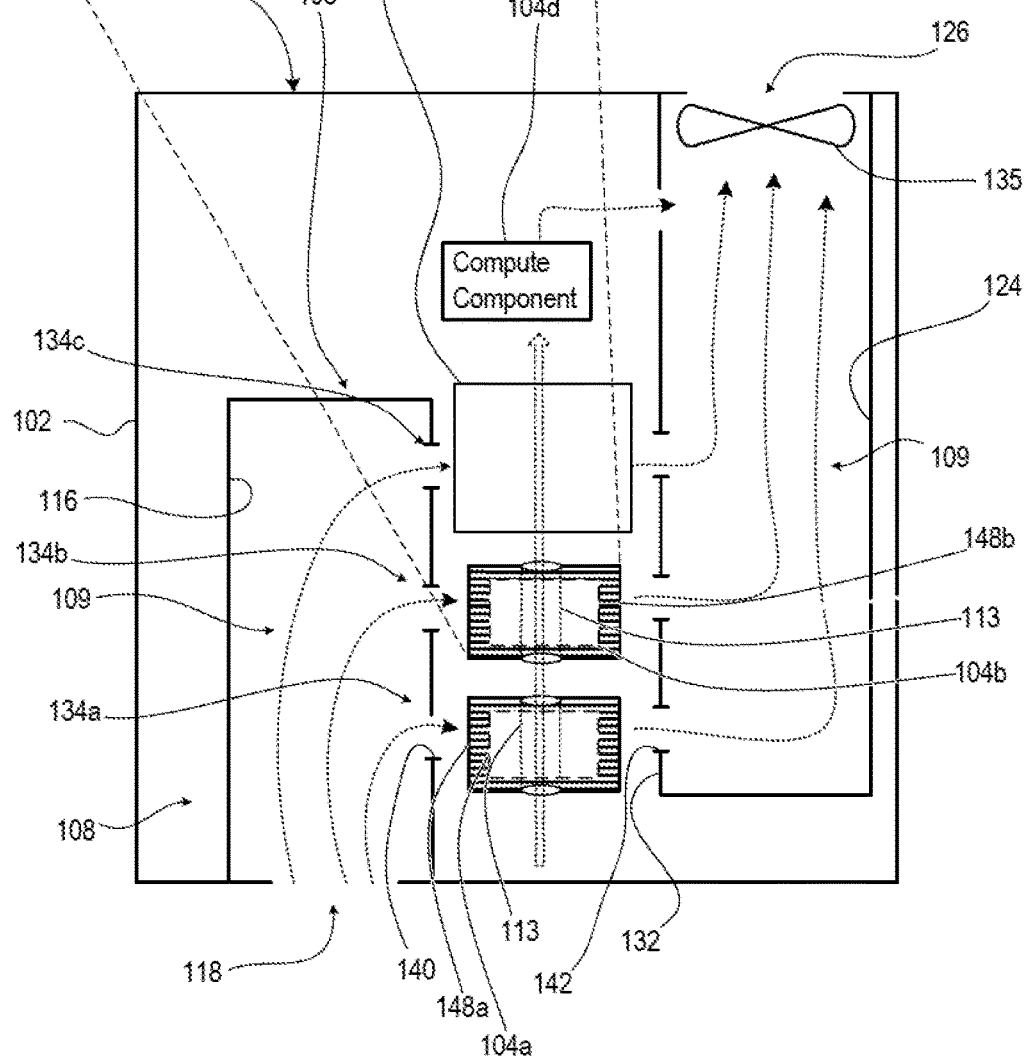
FIG. 1B illustrates a diagrammatic view of a rack server that is provisioned with the bi-directional heatsink of FIG. 1A, according to one or more embodiments.
Figure 2:
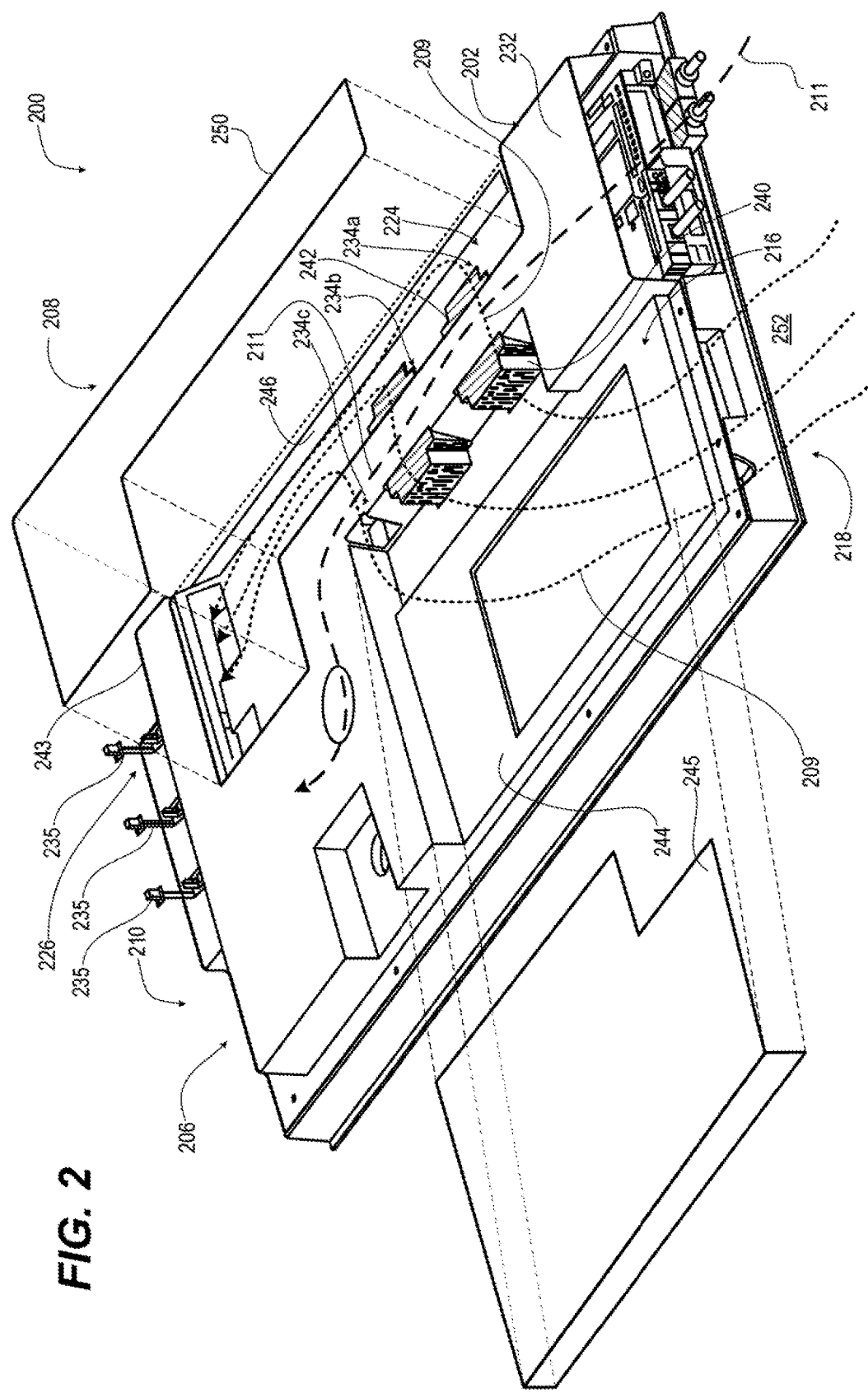
FIG. 2 illustrates a front left isometric view of the bi-directional heatsink of FIG. 1A provisioned in a rack server of an information handling system having a ducting structure that mitigates thermal shadowing of series aligned compute components, according to one or more embodiments.
Figure 4A:
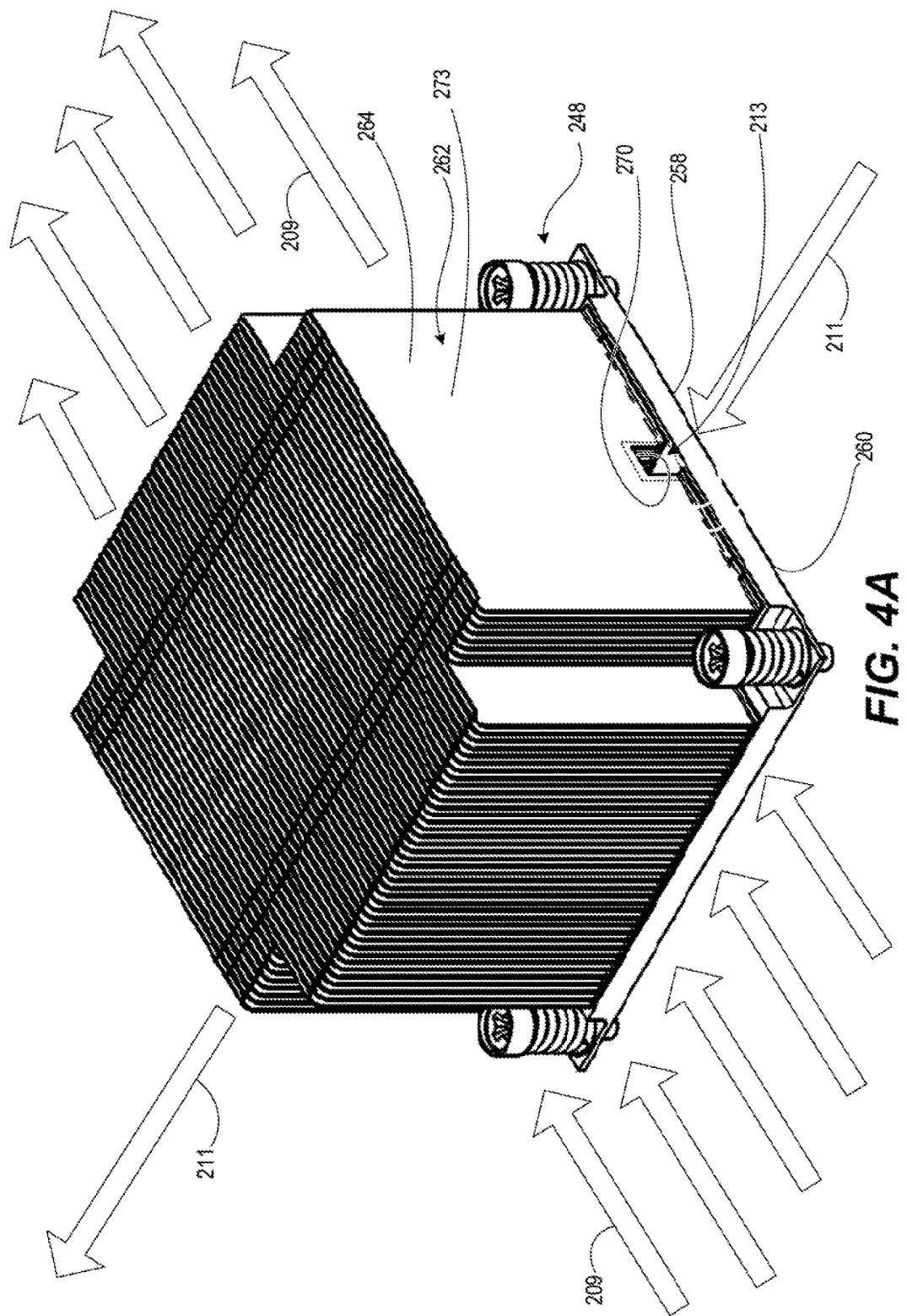
Figure 4B:
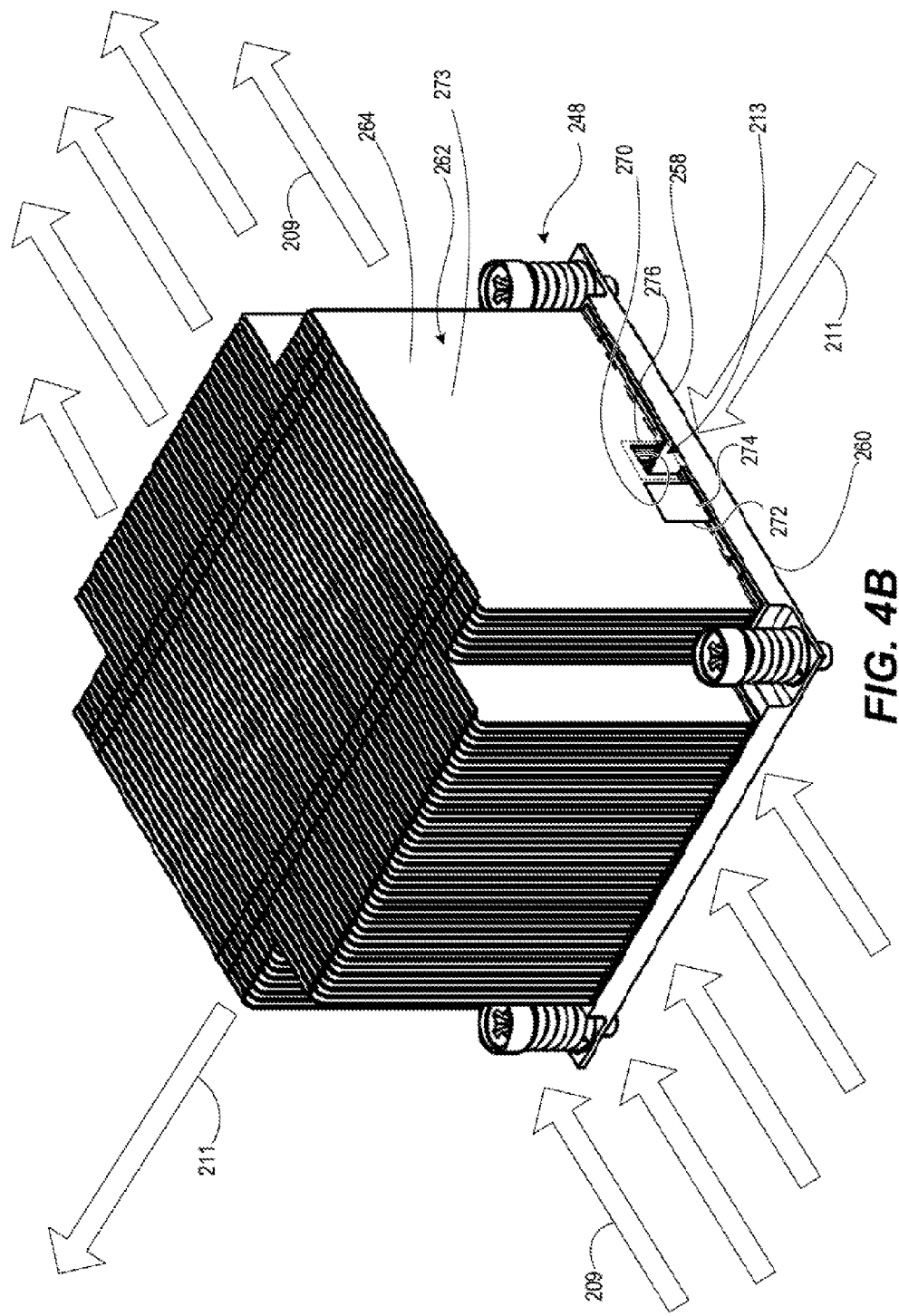
Figure 5:
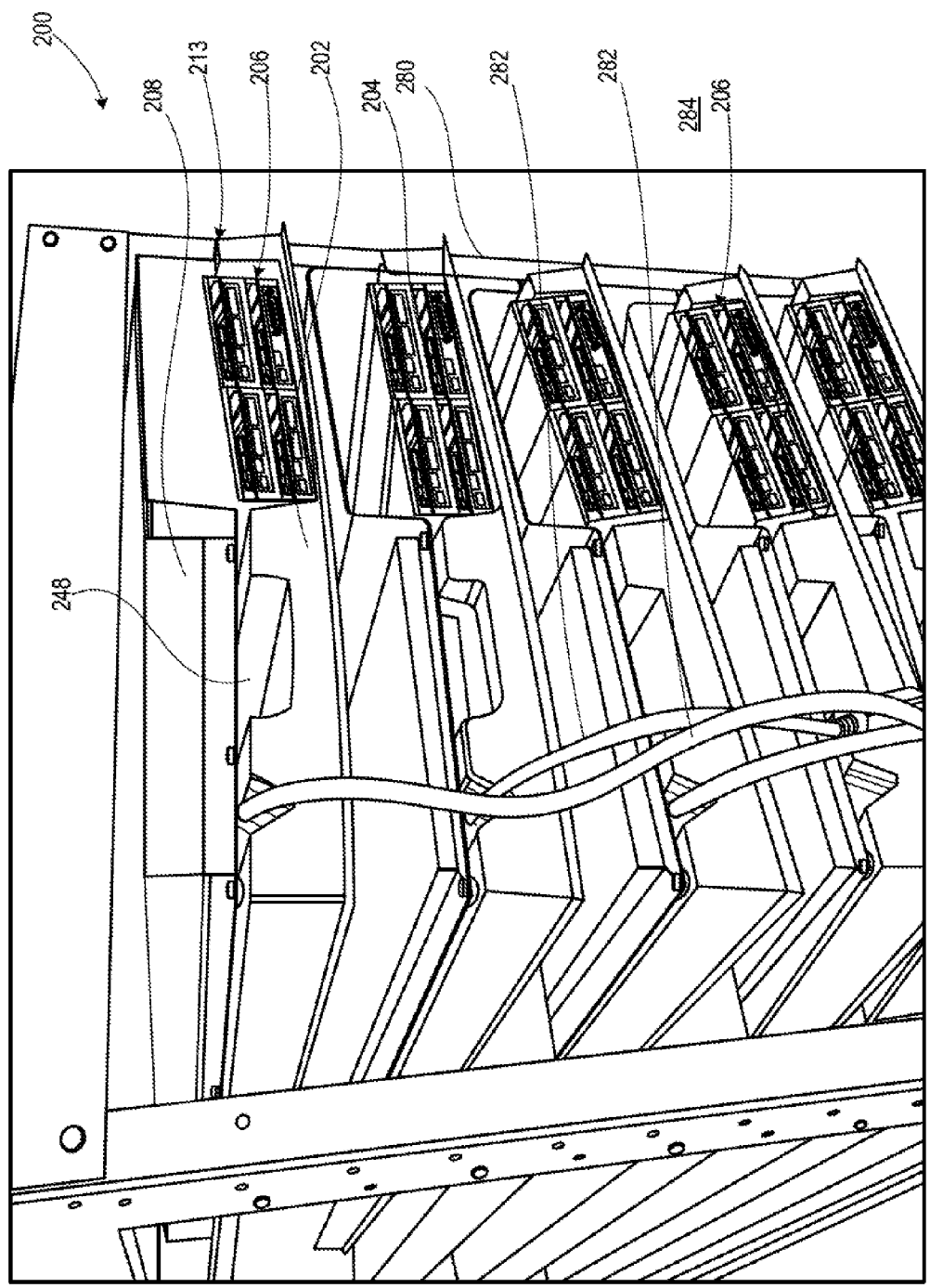
Figure 6:
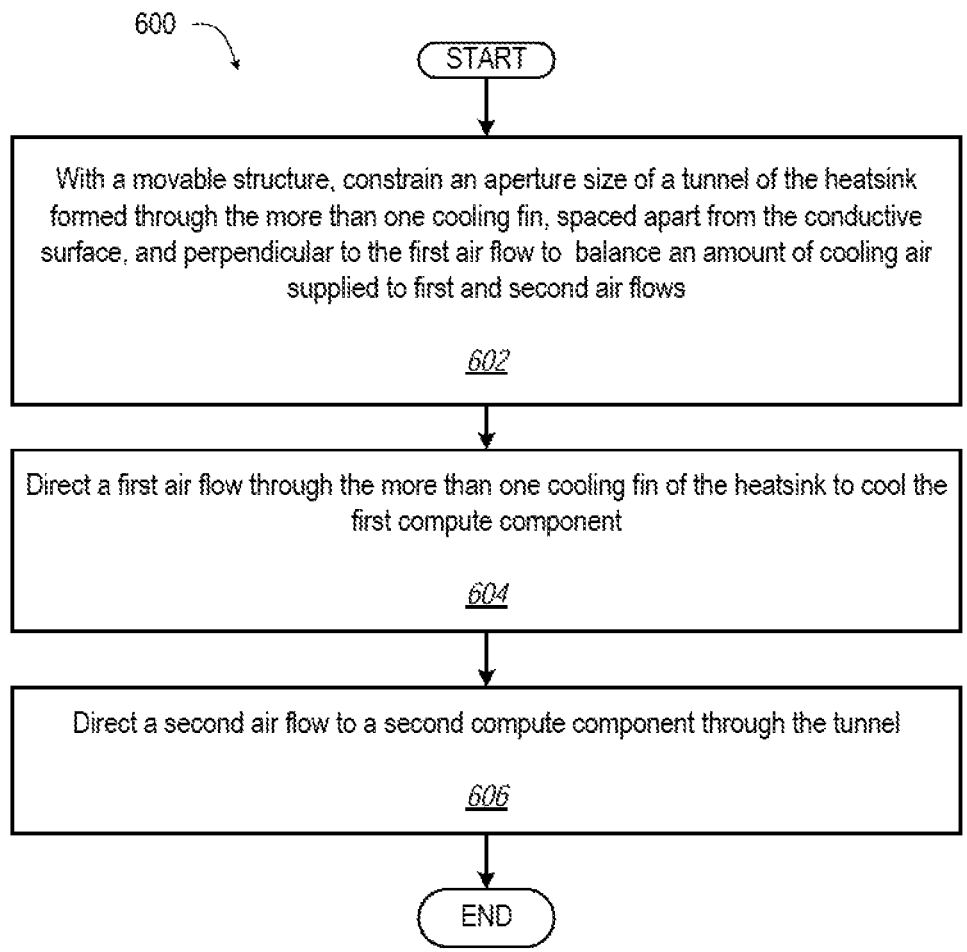
Figure 7:
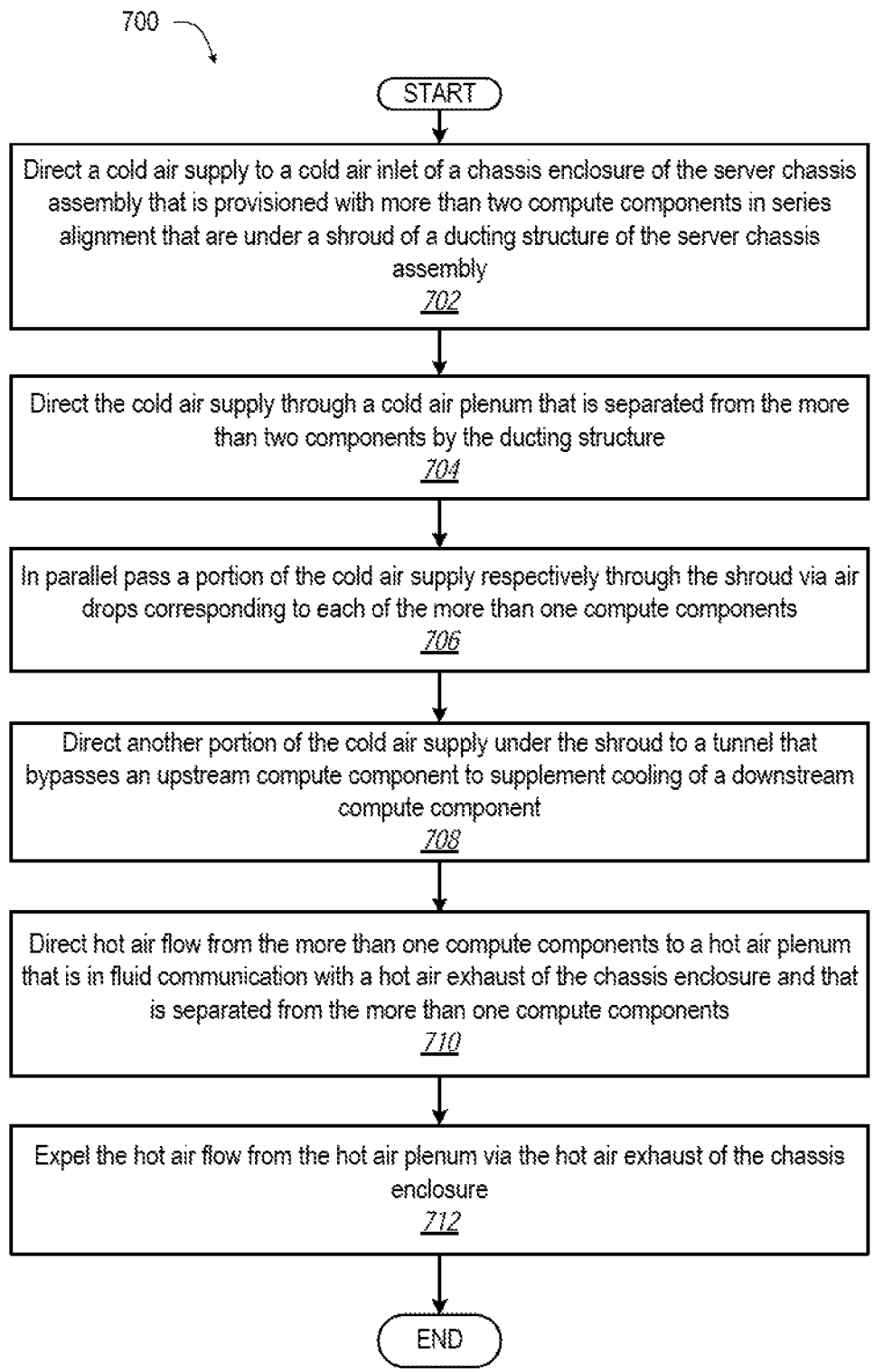
Figure 8:
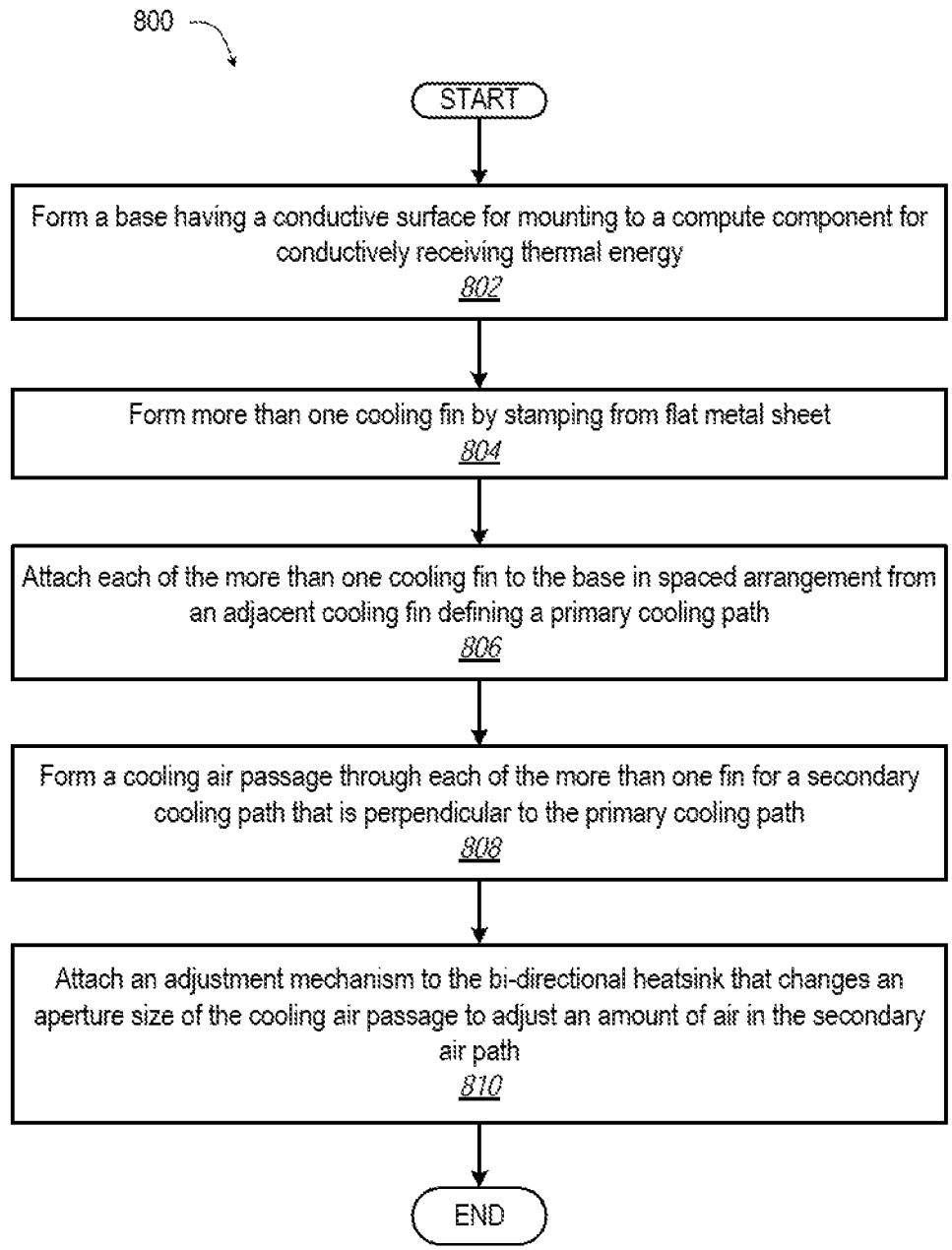

4A illustrates a bi-directional heatsink of the rack server of FIG. 1B, according to one or more embodiments;

FIG. 4B illustrates a bi-directional heatsink of the rack server of FIG. 4A with an adjustment mechanism for balancing an amount of air that passes through an air passage of the heatsink, according to one or more embodiments;

FIG. 5 illustrates the rack server of FIG. 2 mounted to a rack structure, according to one or more embodiments;

FIG. 6 illustrates a flow diagram of a method of cooling compute components with a bi-directional heatsink, according to one or more embodiments;

FIG. 7 illustrates a flow diagram of a method of cooling compute components of an IHS with a ducting structure to a bi-directional heatsink, according to one or more embodiments; and FIG. 8 illustrates a flow diagram of a method of manufacturing a bi-directional heatsink, according to one or more embodiments.

DETAILED DESCRIPTION

The present disclosure provides an information handling system (IHS) has a bi-directional heatsink that conductively receives thermal energy from a compute component. IHS directs cooling air in a first cooling path through cooling fins of the heatsink directly into a hot air plenum to reduce thermally shadowing of other compute components. by convective cooling of received cooling air through a finset as a first cooling path. Additional bi-directional heatsinks can receive a separate, dedicated air flow to avoid pre-heating of the cooling air. Each bi-directional heatsink has a second tunnel that passes a smaller volume of cooling air at higher velocity to minimize pre-heating. The bi-directional heatsink provides this supplemental or alternate first cooling air to other compute components of the IHS. The relative amount of cooling air dedicated to the first and second cooling paths can be fixed or adjustable.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1A illustrates a bi-directional heatsink 148 having a base 158 with a conductive surface 160 for receiving thermal energy from a compute component 104. More than one cooling fin 164 attached to the base 158 (in spaced arrangement) receive a first air flow 109 that is parallel to the conductive surface 160. A tunnel 113 extends through the bi-directional heatsink 148 in a perpendicular direction to the first direction and parallel to the conductive surface 160. The tunnel 113 provides a path through which a second air flow 111 can pass through the heatsink 148 without absorbing a substantial amount of heat. Each cooling fin 164 can include a hole 165 that aligns with adjacent holes 164 to form the tunnel 113.

FIG. 1B illustrates a block diagram representation of an example IHS 100 having a server chassis 102 that houses functional compute components 104a-104c that collectively form a functional server 106 that comprise or is a constituent portion of the IHS 100. Two bi-directional heatsinks 148a, 148b provide cooling for compute components 104a-104b. The server 106 represents one of a plurality of various embodiments of the disclosure. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

With continued reference to FIG. 1B, compute components 104a-104b can include central processing units (CPU) mounted to respective bi-directional heatsinks 148a, 148b. Compute components 104c-104d that are downstream to the bi-directional heatsinks 148a, 148b can be voltage regulators, Peripheral Component Interconnect express (PCIe) redundant array of independent disks (RAID) card behind a motherboard, and a solid state drive (SSD). With conventional implementations of server chassis 102, the temperature of downstream compute components 104c, 104d from upstream compute components 104a, 104b can increase due to reduced air flow. The present innovation addresses these and other deficiencies by having the bi-directional heatsink 148a, 148b that reduces pre-heating of downstream compute components 104c, 104d by receiving a first air flow 109 for cooling the respective upstream compute components 104a, 104b. The bi-directional heatsinks 148a, 148b further provide for a second air flow 111 that supplements cooling of the downstream compute component 104c that can also receive first air flow 109. The bi-directional heatsinks 148a, 148b further provide for the second air flow 111 that can serve as all of the cooling air directed to the downstream compute component 104d, which does not receive first air flow 109.

With regard to the first air flow 109, the ducting structure 108 is positioned in the server chassis 102. The ducting structure 108 defines a cold air plenum 116 in fluid communication with a cold air inlet 118 of the server chassis 102. The ducting structure 108 defines a hot air plenum 124 in fluid communication with a hot air exhaust 126 of the server chassis 102. The ducting structure 108 has a shroud 132 that separates the cold air plenum 116 and the hot air plenum 124. The ducting structure 108 defines air drops 134a-134c, in parallel with each other. Each air drop 134a-134c is directed at and corresponds respectively to one of compute components 104a-104c. Each of the more than one air drop 134a-134c is in fluid communication between the cold air plenum 116 and the hot air plenum 124, respectively directing cooling air supply through the shroud 132.

Cold air can be pushed through the ducting structure 108. FIG. 1B illustrates first and second air flows 109, 111 alternatively being pulled through the ducting structure 108 by a fan 135. For clarity, only one fan 135 is depicted to draw both the first and second air flows 109, 111. Other embodiments can have one or more fans 135 dedicated to one of the first and second air flows 109, 111. The compute components 104a-104c are provisioned in the server chassis 102 under the shroud 132 of the ducting structure 108. The compute components 104a-104c are in series alignment with each other between the cold air inlet 118 and the hot air exhaust 126. Each air drop 134a-134c includes an intake opening 140 that receives cold air from the cold air plenum 116 and an outlet opening 142 that exhausts heated air from the compute component 104a-104c under the shroud 132 to the hot air plenum 124. Intake and outlet openings 140, 142 are a pair of openings on respective lateral sides of the shroud 132. The shroud 132 or air drops 134a-134c can include transverse barriers that prevent thermal shadowing. Alternatively, balancing of air flow across respective air drops 134a-134c can minimize pre-heating of other compute components 104a-104c by maintaining a transverse air flow between each paired intake and outlet openings 140, 142.

Figure 3A:
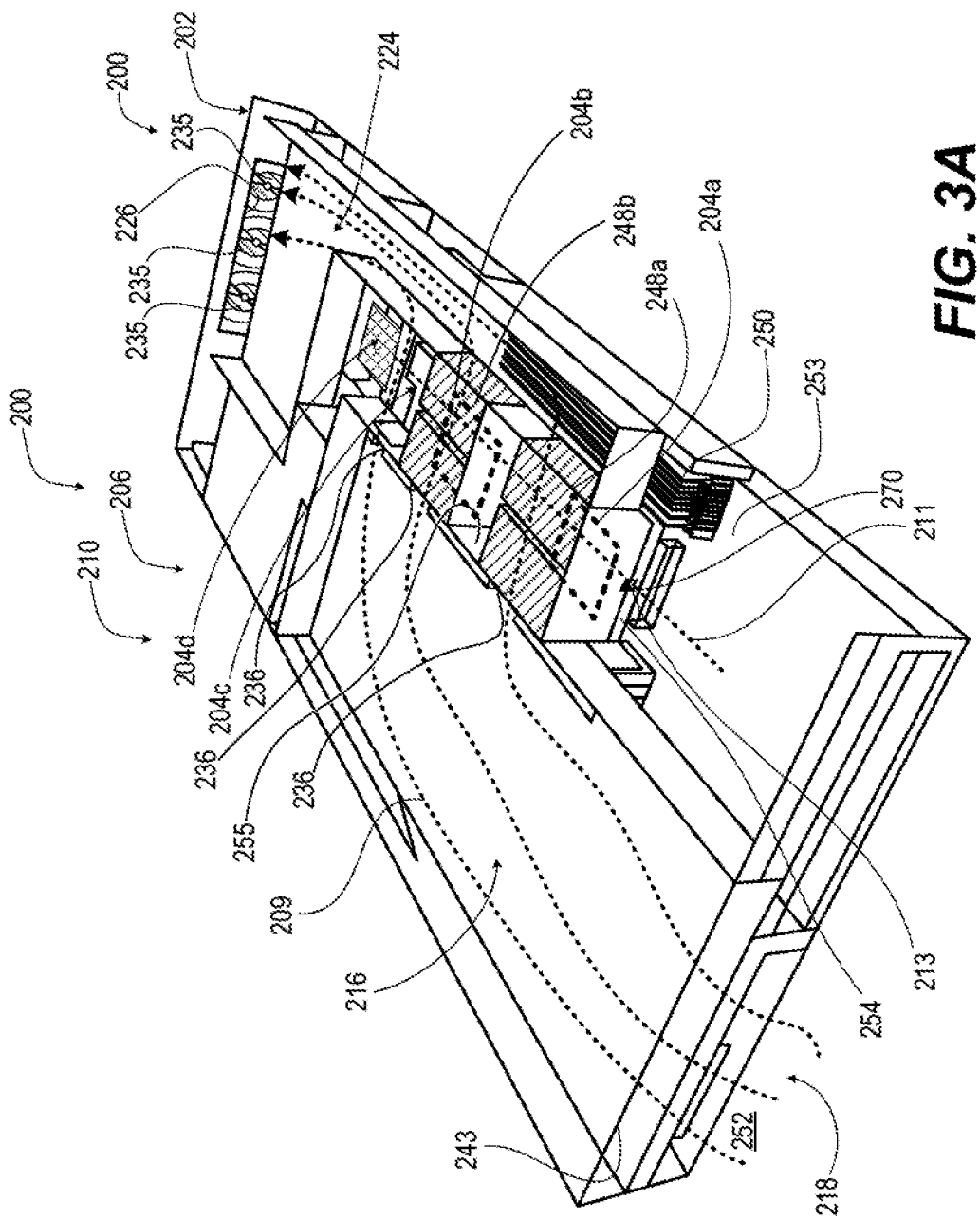
FIG. 3A illustrates a front right isometric view of the rack server of FIG. 2, according to one or more embodiments.

FIGS. 2-3A illustrate an example IHS 200 having a server chassis 202 that houses functional compute components 204a-204d (FIG. 2), which collectively form a functional server 206 that comprises or is a constituent portion of the IHS 200. With particular reference to FIG. 2, the server 206 further includes a ducting structure 208 that is provided in the server chassis 202 and functions to direct cooling air through the server and remove exhaust air from the server. The server chassis 202 and ducting structure 208 form a server chassis assembly 210. The ducting structure 208 includes a molded tray 243 that overlays the compute components 204a-204d (FIG. 3A). The ducting structure 208 defines a cold air plenum 216 that is in fluid communication with a cold air inlet 218 formed in the server chassis 202. In particular, a cold air recessed portion 244 formed in the molded tray 243 is closed by a cold air cover 245. The ducting structure 208 defines a hot air plenum 224 in fluid communication with a hot air exhaust 226 of the server chassis 202. In particular, a hot air recessed portion 246 formed in the molded tray 243 is closed by a hot air cover 250. A raised shroud 232 of the molded tray 243 separates the cold air plenum 216 and the hot air plenum 224. Each air drop 234a-234c corresponds respectively to one compute component 204a-204c (FIG. 3A) under the raised shroud 232. Each air drop 234a-234c is in fluid communication respectively between the cold air plenum 216 and the hot air plenum 224 directing cooling air supply 252 in parallel through the raised shroud 232 as a first air flow 209. Each air drop 234a-234c includes an intake opening 240 that receives cold air from the cold air plenum 216 and an outlet opening 242 that exhausts heated air from the compute component 204a-204c (FIG. 3A) under the raised shroud 232 to the hot air plenum 224. Under the raised shroud 232, a second air flow 211 is directed between the cold air inlet 218 and the hot air exhaust 226.

The first air flow 209 is separated from compute components 204a-204c (FIG. 3A) by the ducting structure 208 as the first air flow 209 is directed generally longitudinally from the cold air inlet 218 to the hot air exhaust 226 with a transverse portion to cool the compute components 204a-204c (FIG. 3A). In particular, air drops 234a-234c between the cold air plenum 216 and the hot air plenum 224 direct the first air flow 209 transversely with respect to a longitudinal axis of the server chassis 202. A portion of the first air flow 209 passes through each of the pair of openings of a respective air drop 234a-234c. The portions of the first air flow 209 passing through each air drop 234a-234c are in parallel with each other. In one embodiment, the raised shroud 232 passes over 204a-204d (FIG. 3A) that are mounted to a bottom surface 253 of the server chassis 202 or a motherboard 254 on the bottom surface 253. A longitudinal passage 255 is formed by the raised shroud 232 closed from below by the bottom surface 253 and/or motherboard 254 (FIG. 3A).

The air drops 234a-234b can pneumatically keep separate the first air flow 209 from other air flow through the raised shroud 232, specifically the second air flow 211. In particular, the intake opening 240 can be shaped to interface to a particular compute component 204a-204b. The second air flow 211 is directed generally longitudinally through the raised shroud 232 in the longitudinal passage 255 from the cold air inlet 218 to the hot air exhaust 226 (FIG. 3A).

With particular reference to FIG. 3A, the server 206 is illustrated with the ducting structure 208 (FIG. 2) rendered transparent to illustrate interfaces to the compute components 204a-204d, although the effects of the ducting structure 208 on the first and second air flows 209, 211 are still illustrated. In one embodiment, FIG. 3A illustrates the upstream compute components 204a, 204b as respectively being bi-directional heatsinks 248a, 248b. To accommodate the second air flow 211, the bi-directional heatsinks 248a, 248b are designed to each incorporate a tunnel 213 running substantially perpendicular to the direction of cooling fins 264 (FIG. 4A) and the first air flow 209 to allow the second air flow 211 to traverse through the cooling fins 264 (FIG. 4A) without being significantly pre-heated during such passage. The server 206 is configured to serve two central processing unit (CPU) sockets (not shown), which are depicted as being under heatsinks 248a, 248b. The heatsink-capped CPUs are serially aligned (from front to back sections of server chassis) in order to provide room for adjacent dual in-line memory modules (DIMMs) 250. Absent the innovative features of FIGS. 1A-B-3A-B and the other aspects of the disclosure described herein, orienting CPUs in series causes thermal energy from the first, upstream CPU via heatsink 248a to preheat the second, downstream CPU mounted to heatsink 248b, as cooling air generally moves from a cold air inlet 218 to a hot air exhaust 226 of the server chassis 202. A downstream compute component 204c can also receive pre-heated air from both bi-directional heatsinks 248a, 248b.

In FIG. 3A, compute components 204a, 204b generate a relatively large amount of thermal energy. To prevent pre-heating of cooling air to compute components 204c, 204d, the first air flow 209 from air drops 234a, 234b is prevented from joining the second air flow 211 in the longitudinal passage 255. The second air flow 211 does not move along the cooling fins 264 (FIG. 4A). In particular, the second air flow 211 does not flow parallel through a finset 262 as does the first air flow 209. Instead, the second air flow 211 is restricted to only the tunnels 213 of each heatsink 248a, 248b, which tunnels 213 allow the second air flow 211 to pass through at relatively high velocity to cool downstream compute components 204c, 204d. The relatively narrow size of the tunnel 213 directs a higher velocity stream of air with minimal surface area contact with the respective heatsink 248a, 248b. The air drops 234a-234c include or entirely comprise an opening on one side of the raised shroud 232 that communicates with the cold air plenum 216 and an opening on the other side of raised shroud 232 that communicates with the hot air plenum 224. In the exemplary embodiment, intake and outlet openings 240, 242 of air drops 234a, 234b are shaped to closely approximate and to expose lateral sides of bi-directional heatsinks 248a, 248b, directing the cold air through a finset 262 of each heatsink 248a, 248b. Thereby, both heatsinks 248a, 248b and their corresponding air drop 234a-234b provides parallel transverse paths to channel the first air flow 209, while allowing a relatively high velocity second air flow 211 to pass through the raised shroud 232 through the tunnels 213.

As one specific implementation (i.e., the illustrative embodiment), bi-directional heatsinks 248a, 248b are illustrated as benefitting from the ducting structure 208. However, the ducting structure 208 can be configured to support cooling of other numbers of heatsinks and various types of heatsinks. In addition, the ducting structure 208 can support cooling of other types of compute components 204c-204d that are not necessarily cooled by heatsinks.

Figure 3B:
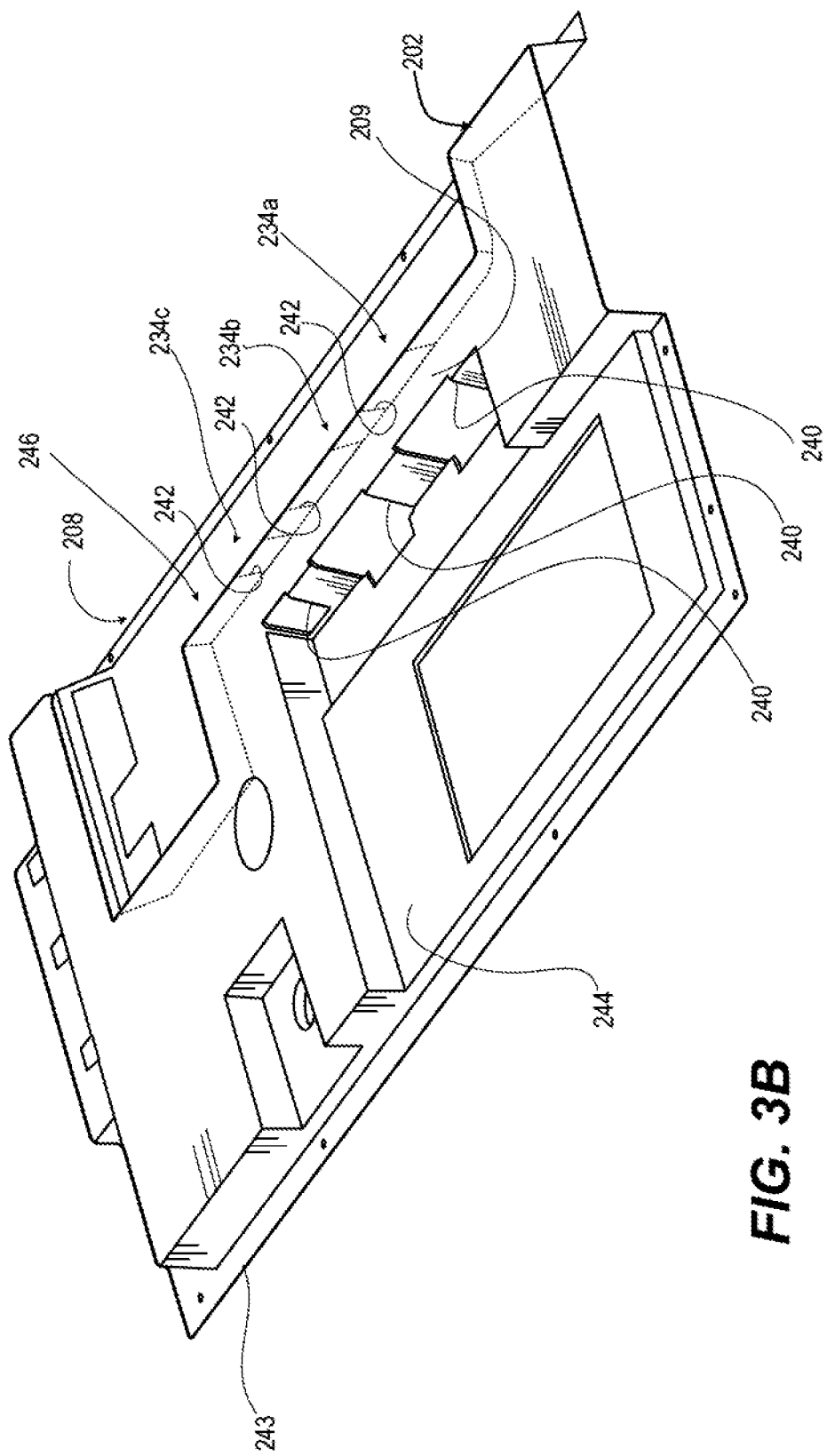
FIG. 3B illustrates a front left isometric view of a molded tray of the ducting structure of FIG. 2, according to one or more embodiments.

FIG. 3B illustrates the ducting structure 208 with intake openings 240 of air drops 234a-234c on the side of the cold air plenum 216 visible and with outlet openings 242 of air drops 234a-234c on the side of the hot air plenum 224 hidden and illustrated in phantom. The molded tray 243 of the ducting structure 208 can be vacuum formed to form the raised shroud 232 flanked by the cold air recessed portion 244 and the hot air recessed portion 246.

FIG. 4A illustrates a heatsink 248 that has a base 258 with a conductive surface 260 for receiving thermal energy from a compute component 204a-204b (FIG. 3A) such as a CPU. The heatsink 248 dissipates thermal energy through the finset 262 that receives thermal energy from the base 258. The finset 262 is formed from more than one cooling fins 264 having a plate structure that is stamped from sheet metal. In one embodiment, each cooling fin 264 includes an aperture 270 stamped out during fabrication. Each cooling fin 264 is attached to the base 258 by solder brazing or press fitting in spaced arrangement with the apertures 270 aligned to form the tunnel 213. For clarity, the cooling fins 264 have a parallel arrangement; however, other geometric relationships can be incorporated. The finset 262 receives the first air flow 209 that is parallel to the conductive surface 260 and to the plate structure of each cooling fin 264. To mitigate thermal shadowing of a downstream compute component 204c (FIG. 3A), the heatsink 248 has a tunnel 213 formed through the more than one cooling fin 264. The tunnel 213 is also formed perpendicularly to the first air flow 209, directing the second air flow 211 to downstream compute components 204c, 204d (FIG. 3A). Fans 235 located at the hot air exhaust 226 pull the first and second air flows 209, 211. although other embodiments can include cold air being pushed into the cold air inlet 218. In other embodiments, the first air flow 209 is supported by one or more dedicated fans and the second air flows 211 is supported by one or more dedicated fans.

Flow impedance of the first and second air flows 209, 211 are respectively tuned so that the majority of the total system airflow passes through the first direction (first air flow 209) of the heatsink 248a, 248b that is parallel to fin orientation. Only a small amount of total air passes through the air passages as second air flow 211 (perpendicular to fin orientation). This tuning can be accomplished by right-sizing the physical constraints on the first and second air flows 209, 211 so that they are appropriately proportioned in their flow impedance. For example, an aperture 270 of the tunnel 213 has a size that can dictate an air balance between the first and second air flows 209, 211. Other factors can affect the amount of air that moves through the first and second air flow. For example, one factor can be magnitude of air pressure presented respectively to the finset 262 of the heatsink 248 and to the tunnel 213. Another factor can be an effective aperture size presented by the finset 262. An additional factor can be pneumatic constraints provided by the air drops 234a-234c (FIG. 2), etc.

In one embodiment, FIG. 4B illustrates the heatsink 248 including a movable structure 272 constraining a size of the aperture 270 of the tunnel 213 to balance an amount of cooling air supplied to the first and second air flows 209, 211. The movable structure 272 can be a slider block that is slidably received in the base 258, overlapping a portion of an exposed surface 273 of the finset 262. The exposed surface 273 is the cooling fin 264 that is presented laterally across the raised shroud 232 upstream or downstream with respect to the other cooling fins 264 of the finset 262 relative to the directional flow of the second air flow 211. Alternatively or in addition, a slider block can be mounted to the cooling fin 264 that is presented laterally across the raised shroud 232 downstream with regard to the other cooling fins 264. The movable structure 272 is selectably positionable in a continuous range between an unobstructing state 274 and an obstructing state 276. The position of the movable structure 272 can be determined empirically for a group of similarly configured servers 206 by measuring an operational temperature within the server chassis 202 of a representative version of the IHS 200 instrumented with temperature sensors. The movable structure 272 can be moved from the obstructing state 276 incrementally toward the unobstructing state 274 until the measured temperature is lowered below a threshold. Similar servers 206 can be configured with the same position without testing.

FIG. 5 illustrates an IHS 200 that includes a rack frame 280 that receives servers 206 having a ducting structure 208. Cabling interconnects 282 provide communication and electrical power to compute components 204 to create a functional IHS 200. Exterior cold air ducts and exterior hot air ducts (not shown) can interface the IHS 200 to a cooling system within a data center 284.

FIG. 6 illustrates an exemplary method 600 of cooling two compute components of an IHS. In one embodiment, the method 600 begins at start block. A heatsink is provided having a finset of more than one fin. Each fin has a plate structure and is attached to a base of the heatsink in spaced parallel arrangement. The base of a heatsink has a conductive surface in contact with a first compute component for receiving and dissipating thermal energy. The method 600 includes a movable structure constraining an aperture size of a tunnel of the heatsink formed through the more than one cooling fin, spaced apart from the conductive surface, and perpendicular to the first air flow. Constraining the aperture size balances an amount of cooling air supplied to first and second air flows (block 602). For example, the movable structure can be a slider block that is slidably received in the base overlapping a portion of an outer one of the more than one cooling fin of a heatsink. The movable structure can be selectably positioned between an unobstructing state and an obstructing state. The method 600 includes directing a first air flow through the more than one cooling fin of the heatsink to cool the first compute component (block 604). The method 600 further includes directing a second air flow to a second compute component through the tunnel (block 606).

FIG. 7 illustrates an exemplary method 700 of cooling of compute components provisioned in series alignment within a server chassis assembly of an IHS. In one embodiment, the method 700 begins at start block. The method 700 includes directing a cold air supply to a cold air inlet of a chassis enclosure of the server chassis assembly (block 702). The method 700 includes directing the cold air supply through a cold air plenum that is separated from the more than two components by the ducting structure (block 704). The method 700 includes passing in parallel a first portion of the cold air supply through the shroud via respective air drops each corresponding to one of the compute components (block 706). In one embodiment, the method 700 includes directing another portion of the cold air supply through the shroud to a tunnel, which allows the second portion of cold air supply to bypass an upstream compute component providing cooling of a downstream compute component (block 708). The method 700 includes directing hot air flow from the compute components to a hot air plenum that is (a) in fluid communication with a hot air exhaust of the chassis enclosure and that is (b) separated from the compute components (block 710). Finally, the method 700 includes expelling the hot air flow from the hot air exhaust of the chassis enclosure (block 712). Then method 700 ends.

FIG. 8 illustrates an exemplary method 800 of manufacturing a bi-directional heatsink for a compute component of an IHS having a second air path for supplementing cooling or providing alternate first cooling to other compute components. The method 800 begins at start block. The method 800 includes forming a base having a conductive surface for mounting to a compute component for conductively receiving thermal energy (block 802). The method 800 includes forming more than one cooling fin. In one embodiment, each cooling fin is formed by stamping from flat metal sheet (block 804). The method 800 includes attaching each of the more than one cooling fin to the base in spaced arrangement from an adjacent cooling fin defining a first cooling path (block 806). The method 800 includes forming a tunnel through each of the more than one fin for a second cooling path that is perpendicular to the first cooling path (block 808). In one embodiment, a hole is stamped into each cooling fin as each cooling fin is formed. The cooling fins as attached to the base such that each hole is aligned to pneumatically communicate with adjacent holes. In one embodiment, the method 800 further includes attaching an adjustment mechanism to the bi-directional heatsink that changes an aperture size of the tunnel to adjust an amount of air in the second air path (block 810). Then method 800 ends.

In the above described flow charts of FIGS. 6-8, one or more of the methods may be embodied in an automated cooling system or an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A heatsink comprising:
    a base having a conductive surface for receiving thermal energy;
    more than one cooling fin attached to the base and receiving a first air flow that is parallel to the conductive surface;
    a tunnel extending through the heatsink in a perpendicular direction to a first direction of the first air flow, the tunnel providing a path through which a second air flow can pass through the heatsink without absorbing a substantial amount of heat; and
    a movable structure constraining an aperture size of the tunnel that enables balancing of an amount of cooling air supplied to the at least the second air flow, wherein the movable structure comprises a slider block that is slidably received in the base, overlapping a portion of an outer fin of the more than one cooling fin, and selectably positionable to vary the aperture size.

2. The heatsink of claim 1, wherein the tunnel has a smaller aperture size than a size of the more than one cooling fin to tunnel the second air flow at a higher velocity than the first air flow to cause the second air flow to quickly pass through the tunnel and prevent the second air from absorbing a substantial amount of heat from a surrounding perimeter of the tunnel.

3. The heatsink of claim 1, wherein the more than one cooling fin are vertically arranged parallel to each other.

4. The heatsink of claim 1, wherein the conductive surface is shaped to contact a heat spreader of a central processing unit (CPU) integrated circuit (IC).

5. An information handling system (IHS) comprising:
    a chassis enclosure having a cold air inlet and a hot air exhaust;
    a compute component that generates thermal energy;
    a heatsink that is series aligned with and closer to the cold air inlet than the compute component, the heatsink comprising:
        a base having a conductive surface for receiving thermal energy;
        more than one cooling fin having a plate structure and attached to the base in spaced parallel arrangement receiving a first air flow that is in parallel alignment to the conductive surface; and
        a tunnel formed through one of the base and the more than one cooling fin in a perpendicular direction to the first air flow, directing a second air flow to a downstream compute component; and
    a ducting structure that is received in the chassis enclosure and that directs intake air to the first and second air flows;
    wherein the ducting structure comprises a molded tray contoured with the cold air plenum, the hot air plenum, and the shroud; and
    wherein each of the more than one air drop comprise an intake pneumatic port and an outlet pneumatic port attached on lateral sides of the shroud corresponding to a respective one of the more than one compute component.

6. The IHS of claim 5, further comprising a second heatsink having a tunnel aligned with the tunnel of the heatsink to direct the second air flow to the downstream computer component.

7. The IHS of claim 5, wherein the ducting structure defines a cold air plenum in fluid communication with the cold air inlet, defines a hot air plenum in fluid communication with the hot air exhaust, and having a shroud that separates the cold air plenum and cold air plenums and encompasses the more than one compute component; the ducting structure comprises more than one air drop that correspond to the more than one compute component and that fluid communicate between the cold air plenum and hot air plenum to direct in parallel cooling air supply for each compute component; wherein a second air flow passage that is under the shroud supplies a second air supply from the cold air inlet under the shroud passes through the tunnel of the heatsink providing cooling of the compute component.

8. The IHS of claim 5, wherein the heatsink further comprises a movable structure constraining an aperture size of the tunnel balancing an amount of cooling air supplied to the first and second air flows.

9. The IHS of claim 8, wherein the movable structure comprises a slider block that is slidably received in the base overlapping a portion of an outer one of the more than one cooling fin and selectably positionable between an un-obstructing state and a fully obstructing state.

10. The IHS of claim 5, further comprising a central processing unit (CPU) integrated circuit (IC), wherein the conductive surface of the heatsink is shaped to contact a face of the CPU IC.

11. A method of cooling two compute components of an information handling system (IHS), the method comprising:
    directing a first air flow through more than one cooling fin, each having a plate structure and attached to a base in spaced parallel arrangement of a heatsink having a conductive surface in contact with a first compute component for receiving and dissipating thermal energy;
    directing a second air flow to a second compute component through a tunnel of the heatsink formed through one of the base and the more than one cooling fin in parallel to the conductive surface and perpendicular to the first air flow; and
    balancing an amount of air supplied to the first and second air flow by adjusting an aperture size of the tunnel by positioning a slider block that is slidably received in the base overlapping a portion of an outer one of the more than one cooling fin and selectably positionable between an un-obstructing state and a fully obstructing state.

12. The method of claim 11, further comprising directing the second air flow through a tunnel of a second heatsink aligned with the tunnel of the heatsink to the downstream computer component.

13. The method of claim 11, wherein directing the first air flow further comprises providing a ducting structure in a chassis enclosure of the IHS wherein the ducting structure that defines a cold air plenum in fluid communication with the cold air inlet, defines a hot air plenum in fluid communication with the hot air exhaust, and has a shroud that separates the cold air plenum and cold air plenums and encompasses the more than one compute component; the ducting structure comprises more than one air passage that correspond to the more than one compute component and that fluid communicate between the cold air plenum and hot air plenum to direct in parallel cooling air supply for each compute component; and wherein directing the second air flow comprises directing cooling air supply under the shroud to an intake side of the tunnel of the heatsink.

* * * * *